(12) United States Patent  
Ueyama

(10) Patent No.: US 12,009,614 B2  
(45) Date of Patent: Jun. 11, 2024

(54) FRAME FOR CONTACT UNIT AND SOCKET

(71) Applicant: Enplas Corporation, Saitama (JP)

(72) Inventor: Yuki Ueyama, Saitama (JP)

(73) Assignee: Enplas Corporation, Saitama (JP)

( * ) Notice: Subject to any disclaimer, the term of this patent is extended or adjusted under 35 U.S.C. 154(b) by 395 days.

(21) Appl. No.: 17/291,621

(22) PCT Filed: Oct. 31, 2019

(86) PCT No.: PCT/JP2019/042844  
§ 371 (c)(1),  
(2) Date: May 6, 2021

(87) PCT Pub. No.: WO2020/095820  
PCT Pub. Date: May 14, 2020

(65) Prior Publication Data  
US 2021/0408719 A1    Dec. 30, 2021

(30) Foreign Application Priority Data

Nov. 7, 2018    (JP) ................................ 2018-209768

(51) Int. Cl.  
*G01R 1/04* (2006.01)  
*H01R 13/502* (2006.01)  
*H01R 12/88* (2011.01)

(52) U.S. Cl.  
CPC ......... *H01R 13/502* (2013.01); *G01R 1/0458* (2013.01); *H01R 12/88* (2013.01)

(58) Field of Classification Search  
CPC ... H01R 13/502; H01R 1/0433; G01R 1/0458  
See application file for complete search history.

(56) References Cited

U.S. PATENT DOCUMENTS 6,257,914 B1    7/2001  Comerci  
6,648,656 B1    11/2003  Ma  
6,877,990 B2 *  4/2005  Liao ...................... H01R 12/88  
                                                        439/41

(Continued)

FOREIGN PATENT DOCUMENTS

CN        1885615 A      12/2006  
JP     H08-167679 A       6/1996

(Continued)

OTHER PUBLICATIONS

International Search Report from International Application No. PCT/JP2019/042844, dated Dec. 17, 2019.

*Primary Examiner* — Neil Abrams  
(74) *Attorney, Agent, or Firm* — Shih IP Law Group, PLLC

(57) ABSTRACT

A frame for a contact unit includes: a resin frame made of resin and a metal frame made of metal. The metal frame has a bottom plate on which the resin plate is disposed, an inner peripheral plate and an outer peripheral plate. Each of the resin frame and the bottom plate has a front side, a rear side, a left side and a right side at front, rear, left and right positions to surround a housing portion of the contact unit. The inner peripheral plate and an outer peripheral plate stand in a first direction from an inner peripheral edge and an outer peripheral edge of the bottom plate respectively to cover at least partially an inner part and an outer part of the resin frame on the bottom plate.

7 Claims, 6 Drawing Sheets

(56) References Cited

U.S. PATENT DOCUMENTS

| | | | |
|---|---|---|---|
| 7,086,902 B1* | 8/2006 | Yang | H01R 12/716 |
| | | | 439/876 |
| 7,128,607 B2* | 10/2006 | Li | H01R 13/6594 |
| | | | 439/607.36 |
| 7,140,901 B2* | 11/2006 | Lin | H01R 12/88 |
| | | | 439/73 |
| 7,168,959 B2* | 1/2007 | Kuo | H01R 12/775 |
| | | | 439/67 |
| 7,854,630 B1* | 12/2010 | Wang | H04N 23/50 |
| | | | 439/607.27 |
| 11,109,502 B2* | 8/2021 | Wu | H05K 3/301 |
| 11,489,291 B2* | 11/2022 | Oosaka | H01R 12/716 |
| 2004/0095693 A1 | 5/2004 | Shirai et al. | |
| 2006/0283948 A1 | 12/2006 | Naito | |
| 2008/0030967 A1* | 2/2008 | Liao | H01R 12/716 |
| | | | 361/752 |
| 2023/0038252 A1* | 2/2023 | Ueyama | G01R 1/0466 |

FOREIGN PATENT DOCUMENTS

| | | | |
|---|---|---|---|
| JP | 2001291556 A | 10/2001 | |
| JP | 2004-207184 A | 7/2004 | |
| JP | 2012113989 A | 6/2012 | |
| JP | 2012-174617 A | 9/2012 | |
| JP | 2014203510 A | 10/2014 | |
| JP | 2017037722 A | 2/2017 | |

* cited by examiner

FRAME FOR CONTACT UNIT AND SOCKET

TECHNICAL FIELD

The present invention relates to a frame for a contact unit and also relates to a socket.

BACKGROUND ART

Sockets including a contact unit have been used for inspecting electrical components such as IC packages as described in, for example, Patent Literature (hereinafter, referred to as "PTL") 1. The contact unit includes a housing portion that houses an electrical component. The front, rear, left, and right of the housing portion are surrounded by a frame that guides an electrical component to the housing portion. In the related art, a frame has been manufactured by cutting the frame out of a metal ingot by machining.

CITATION LIST

Patent Literature

PTL 1
Japanese Patent Application Laid-Open No. 2017-037722

SUMMARY OF INVENTION

Technical Problem

In machining, a processing object can be processed with high accuracy, but there are more processing processes in comparison with other processing methods, such as pressing, which assume mass production. Accordingly, machining leads to a prolonged manufacturing time of a socket, and further to a prolonged lead time between an order of a socket and a delivery thereof.

The present invention has been made to solve such problems. An object of the present invention is to provide a frame for a contact unit, and a socket that can be manufactured in a shorter time than in the related art while maintaining the quality.

Solution to Problem

To solve the above-mentioned problems in the related art, a frame for a contact unit of the present invention surrounds a housing portion of the contact unit, and includes: a metal frame made of metal; and a resin frame made of resin. The metal frame includes: a bottom plate; and an outer peripheral plate standing in a first direction from an outer peripheral edge of the bottom plate, where the outer peripheral edge is opposite to an inner peripheral edge of the bottom plate on a side of the housing portion. The resin frame is disposed on or above the bottom plate.

To solve the above-mentioned problems in the related art, a socket of the present invention includes: a contact unit including a housing portion that houses an electrical component; and the frame for the contact unit.

Advantageous Effects of Invention

The present invention is capable of manufacturing a frame for a contact unit and a socket in a shorter time than in the related art while maintaining the quality.

DESCRIPTION OF EMBODIMENTS

Figure 1:
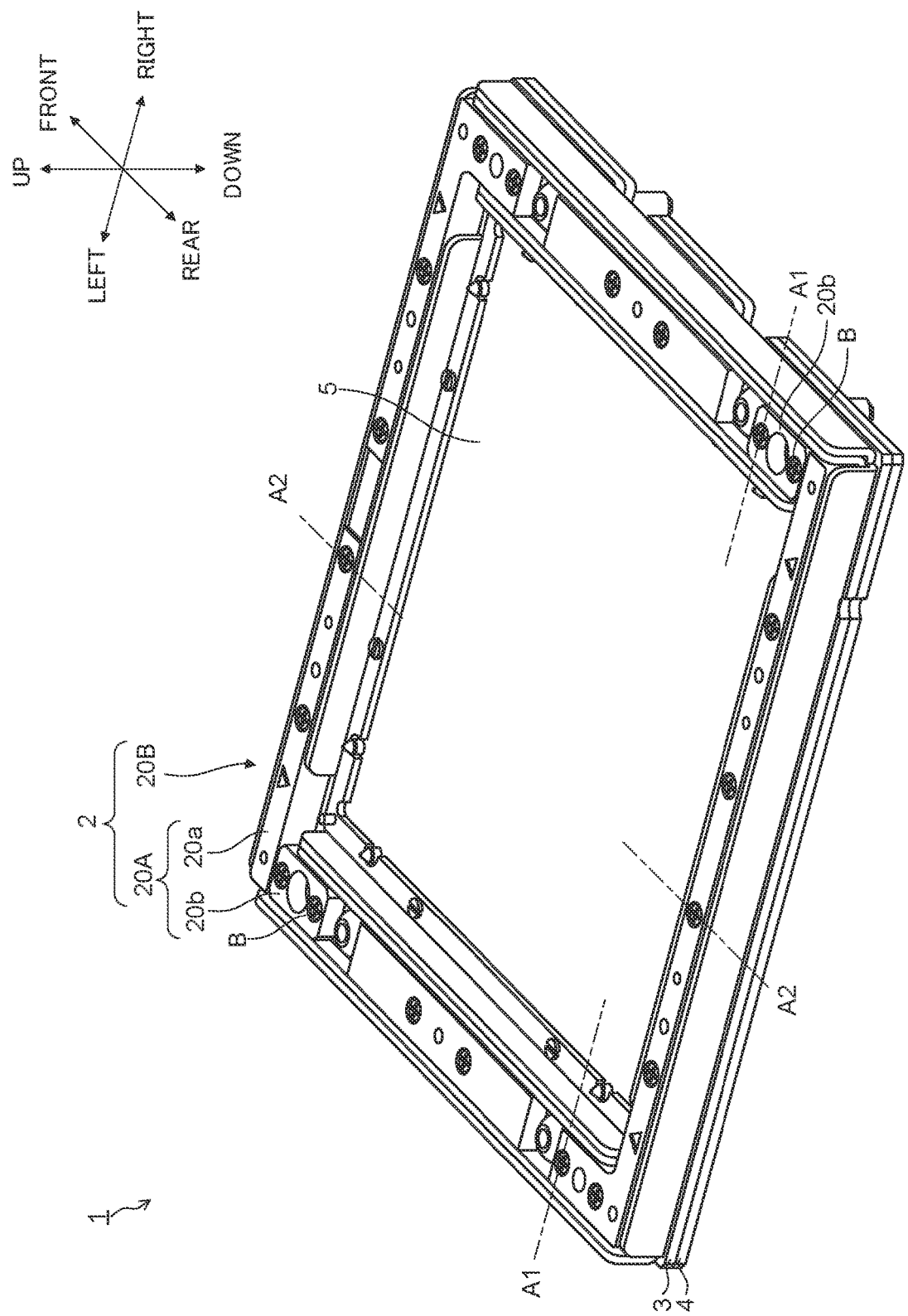
FIG. 1 is a perspective view illustrating a configuration of a frame for a contact unit and the contact unit of an embodiment of the present invention.

Hereinafter, a frame for a contact unit (hereinafter, may be referred to as "contact unit frame") and a socket according to an embodiment of the present invention will be described with reference to the accompanying drawings. The embodiment described below is merely exemplary, and does not exclude various modifications and applications of techniques, which are not explicitly described in the embodiment described below. Further, each configuration of the embodiment can be variously modified and implemented without departing from the scope thereof. Further, each configuration of the embodiment can be selected as needed or can be combined as appropriate.

As the contact unit frame and the socket of the present invention, the following embodiment describes a contact unit frame and a socket that are used in a burn-in test of an IC package. Further, in the following embodiment, a contact pin will be described on the assumption that floating plate 5 to be described later is disposed on an upper side of the contact pin and upper plate 3 is disposed on a lower side of the contact pin for convenience. How the contact pin and the socket are disposed is naturally not limited to such an assumption. Further, for convenience of description, the front, rear, left, and right are defined as indicated each drawing.

In all the drawings for describing the embodiment, an element the same as a precedent element is given, in principle, the same reference numeral, and a description thereof may be omitted.

[1. Configuration]

Figure 2A:
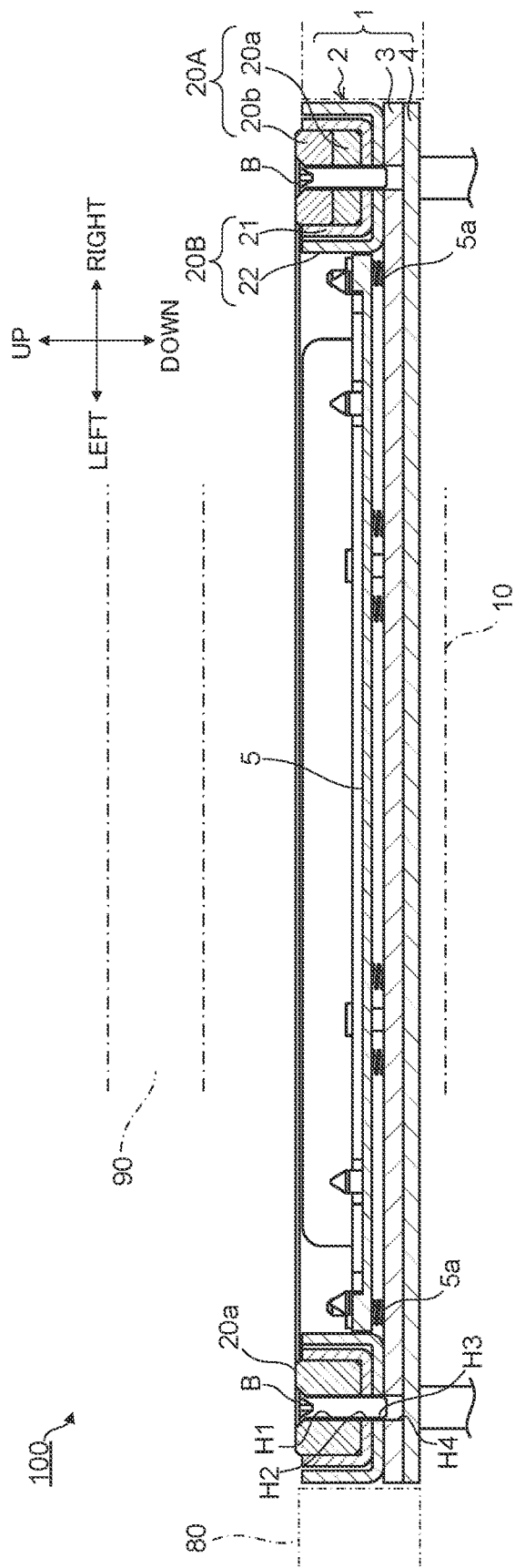
FIG. 2A is a cross-sectional view illustrating a configuration of the frame for the contact unit, the contact unit, and a socket of the embodiment of the present invention, where a vertical cross-section through line A1-A1 of FIG. 1 is viewed from behind.
Figure 2B:
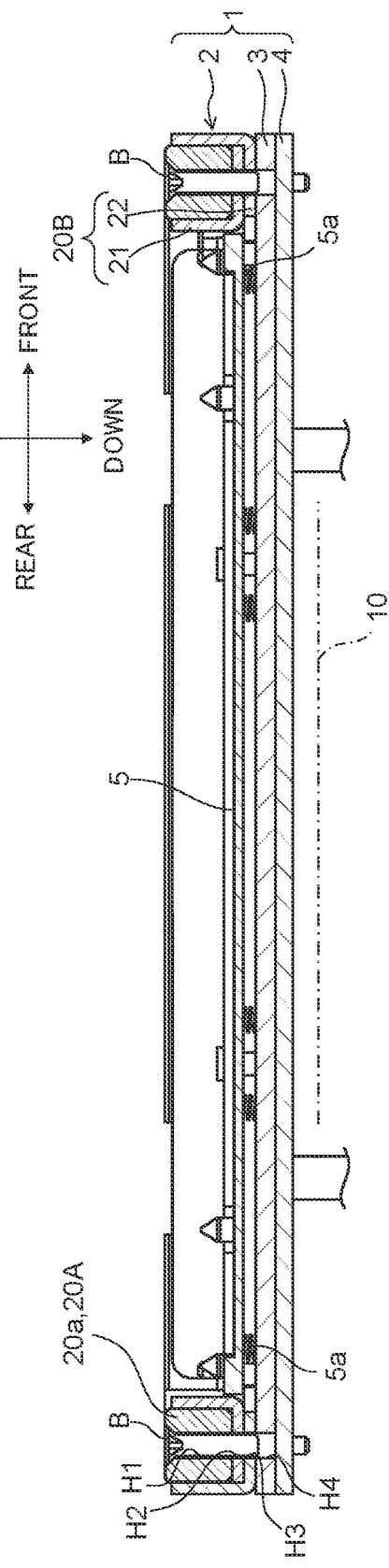
FIG. 2B is a cross-sectional view illustrating the configuration of the frame for the contact unit, the contact unit and the socket of the embodiment of the present invention, where a vertical cross-section through line A2-A2 of FIG. 1 is viewed from a right side.
Figure 3:
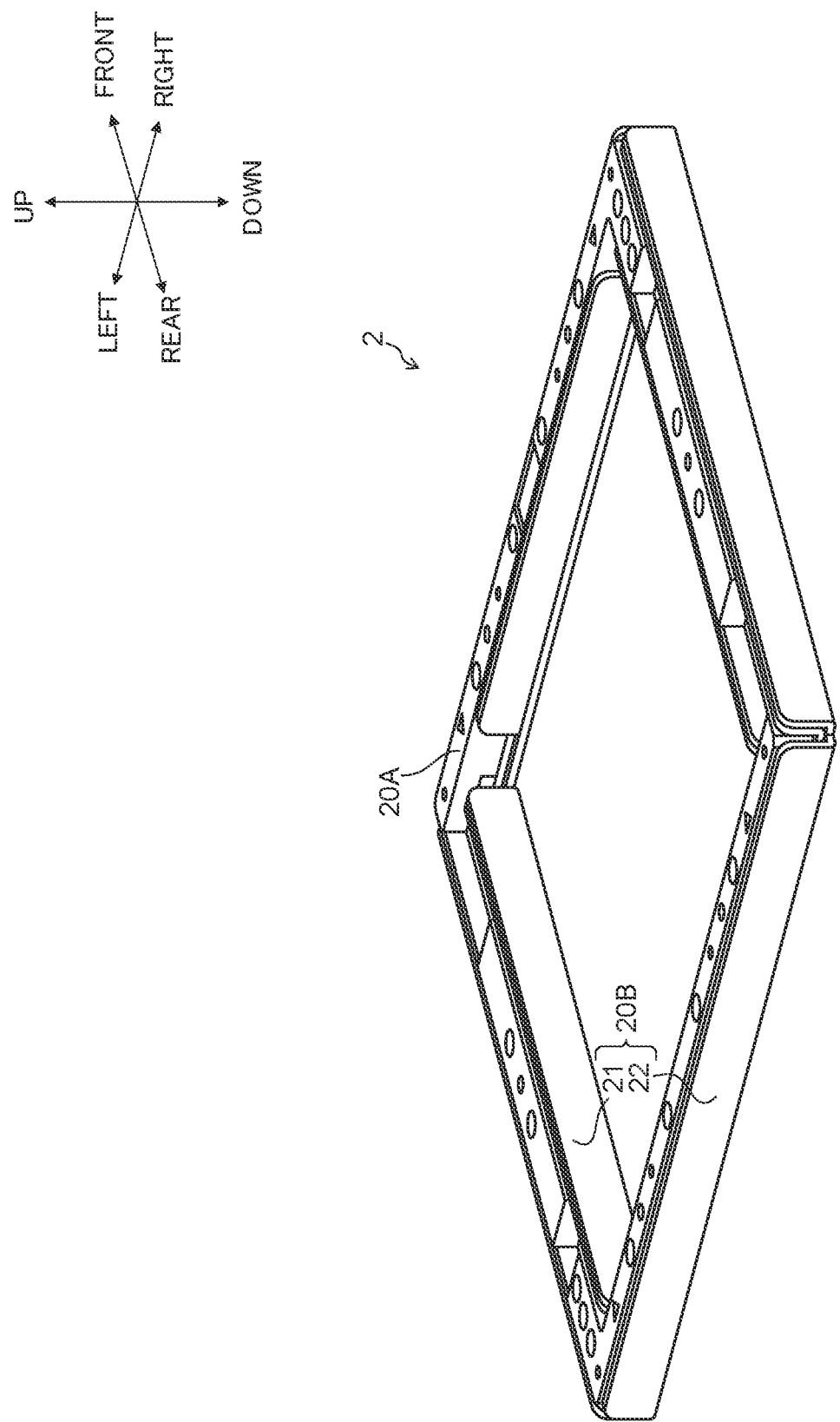
FIG. 3 is a perspective view illustrating a configuration of the frame for the contact unit of the embodiment of the present invention.
Figure 4:
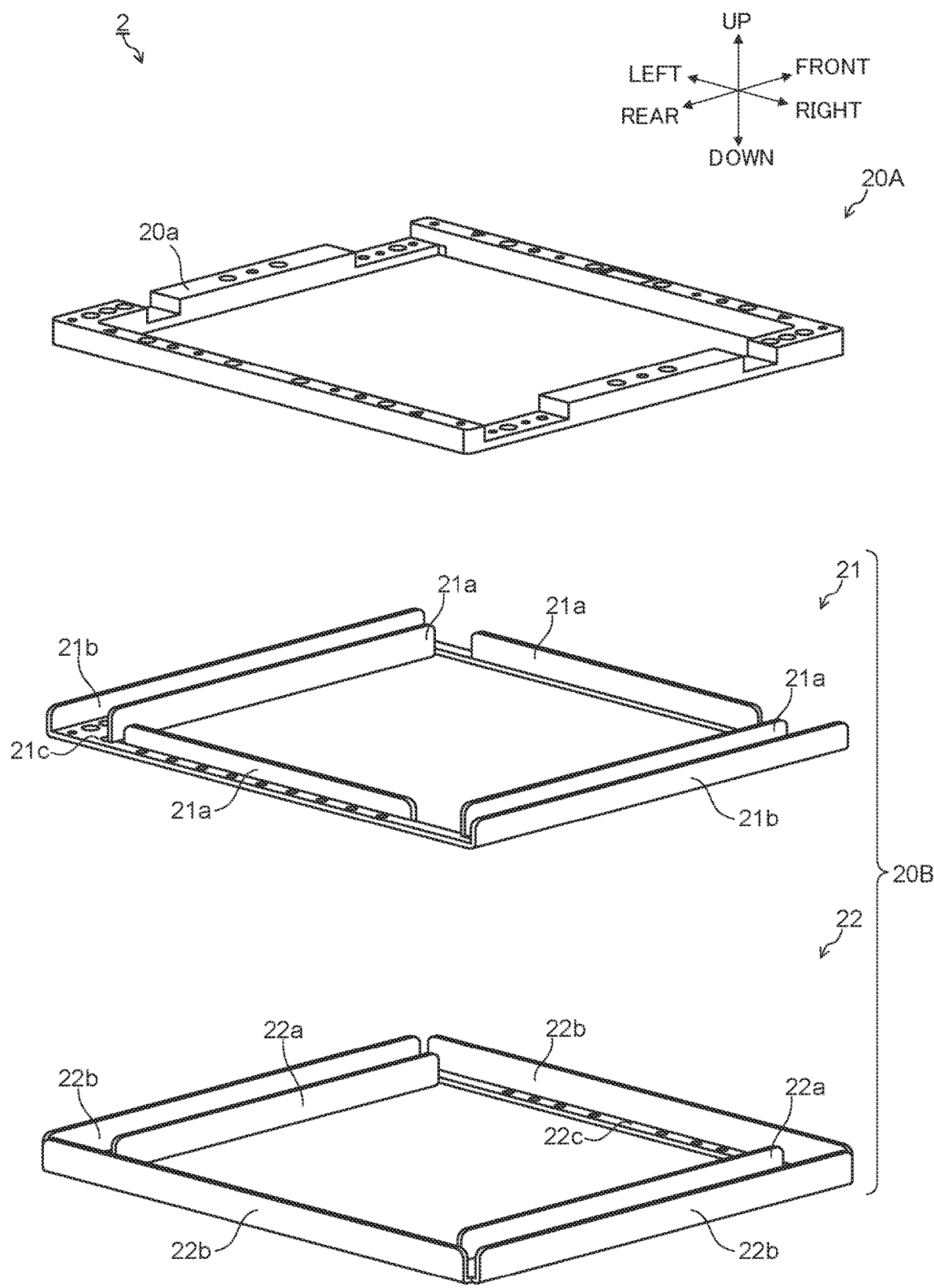
FIG. 4 is an exploded perspective view of the frame for the contact unit of the embodiment of the present invention.

A configuration of a contact unit frame, a contact unit, and a socket of an embodiment of the present invention will be described with reference to FIGS. 1 to 4. FIG. 1 is a perspective view illustrating a configuration of the contact unit frame and the contact unit. FIGS. 2A and 2B are cross-sectional views illustrating a configuration of the contact unit frame, the contact unit, and a socket, where FIG. 2A is a diagram in which a vertical cross-section through line A1-A1 of FIG. 1 is viewed from behind, and FIG. 2B is a diagram in which a vertical cross-section through line A2-A2 of FIG. 1 is viewed from a right side. FIG. 3 is a perspective view illustrating a configuration of the contact unit frame. FIG. 4 is an exploded perspective view of the contact unit frame.

[1-1. Configuration of Contact Unit]

As illustrated in FIGS. 1 to 4, contact unit 1 includes contact unit frame (hereinafter, referred to as "frame") 2, upper plate 3, lower plate 4 fixed to a lower surface of upper plate 3, and floating plate 5. Frame 2 surrounds the front, rear, left, and right of floating plate 5. Upper plate 3 and lower plate 4 are disposed below floating plate 5.

An IC package (not illustrated) as an electrical component in the present invention is housed above floating plate 5. Floating plate 5 forms a housing portion of the present invention. In the present embodiment, floating plate 5 has a rectangular shape in plan view. Further, floating plate 5 is attached to upper plate 3 below via a plurality of coil springs 5a. Floating plate 5 is movable forward and backward with respect to upper plate 3.

In the IC package, a plurality of terminals (for example, solder balls) is arranged in a matrix shape. In floating plate 5, a plurality of through holes (not illustrated) is arranged in a matrix shape in accordance with the arrangement of the plurality of terminals of the IC package. The corresponding terminals of the IC package enter these through holes from above.

A plurality of through holes (not illustrated) is made in upper plate 3 and lower plate 4, respectively. These through holes are arranged in a matrix shape in accordance with the arrangement of the terminals of the IC package and the arrangement of the through holes of floating plate 5. A contact pin (not illustrated) is inserted through each of the through holes arranged upward and downward in upper plate 3 and lower plate 4. Further, contact points of lower parts of the contact pins are connected to electrodes of interconnection substrate 10.

With such a configuration of contact unit 1, when the IC package is pushed together with floating plate 5 against a biasing force of coil springs 5a until the IC package comes into contact with the contact pins, the IC package and interconnection substrate 10 are electrically connected via the contact pins.

[1-2. Configuration of IC Socket]

As illustrated in FIG. 2A, IC socket 100 (socket) of the embodiment of the present invention includes base plate 80, contact unit 1 described above, and cover 90. A through hole is made in a front-rear/left-right center of base plate 80, and contact unit 1 is attached to the through hole. Cover 90 is attached to base plate 80 such that cover 90 is rotatable upward and downward. Further, cover 90 includes a pressing mechanism (not illustrated).

With such a configuration of IC socket 100, the terminals of the IC package can be pressed against the contact pins as described above by operating the pressing mechanism with cover 90 being closed.

[1-3. Details of Frame]

Frame 2 guides the IC package to floating plate 5 on an inner side thereof, and has a frame shape formed of four sides of front, rear, left, and right sides as illustrated in FIGS. 3 and 4. Frame 2 includes resin frame 20A and metal frame 20B. In the present embodiment, metal frame 20B is formed of first metal frame 21 and second metal frame 22. Each of resin frame 20A, first metal frame 21, and second metal frame 22 roughly has a frame shape formed of four sides of front, rear, left, and right sides.

As illustrated in FIGS. 1 and 2A, resin frame 20A includes resin frame body 20a and resin block 20b. Resin frame body 20a is a part obtained by removing resin block 20b from resin frame 20A. In the present embodiment, resin frame body 20a is integrally made, but may be divided into a plurality of resin frame body 20a with respect to the peripheral direction, for example.

Resin block 20b has a substantially rectangular parallelepiped shape, and is disposed at a position where damage easily progresses over time due to wear or the like. Specifically, resin block 20b is provided in a recess made on a top surface of resin frame body 20a such that a top surface of resin block 20b is flush (or substantially flush) with the top surface of resin frame body 20a. In the present embodiment, resin block 20b is disposed at two positions in the vicinity of a corner portion on a front left side of resin frame body 20a and in the vicinity of a corner portion on a rear right side of resin frame body 20a, respectively.

Each of resin frame body 20a and resin lock 20b is made of a heat-resistant resin that can be used at a temperature reached by a socket during a burn-in test (for example, 170° C.). The heat-resistant resin specifically refers to a resin having a melting point of 170° C. or higher.

Specific examples of the heat-resistant resin as such include super engineering plastics such as polyphenylene sulfide (PPS), semi-aromatic polyamide (such as PA6T, PA9T, and PAMXD6), aliphatic polyamide (such as PA46), polyarylate (PAR), liquid crystal polymer (LCP), polysulfone (PSU), polyethersulfone (PES), polyether ether ketone (PEEK), polyetherimide (PEI), polyamideimide (PAI), and thermoplastic polyimide (TPI); and engineering plastics such as polyamide (such as PA6 and PA66), polycarbonate (PC), polyacetal (POM), modified polyphenylene ether (m-PPE), polybutylene terephthalate (PBT), and ultra-high molecular weight polyethylene (UHDPE). Of these, PEI, PES, PEEK, and LCP are preferred.

As illustrated in FIG. 4, first metal frame 21 includes bottom plate 21c (first bottom plate), standing plate 21a (first inner peripheral plate), and standing plate 21b (first outer peripheral plate). Bottom plate 21c is formed of four sides of front, rear, left, and right sides.

Standing plate 21a stands from an inner peripheral edge of bottom plate 21c, that is, from a peripheral edge thereof on a side of floating plate 5 (see FIG. 1). Specifically, standing plate 21a is provided on an entire periphery of bottom plate 21c, that is, on four sides of front, rear, left, and right sides thereof, respectively.

Standing plate 21b stands upward (in a first direction) from an outer peripheral edge of bottom plate 21c, that is, from a peripheral edge of bottom plate 21c opposite to the inner peripheral edge thereof. Specifically, standing plate 21b is provided on the left and right sides of bottom plate 21c, respectively, and is not provided on any of the front and rear sides thereof.

Bottom plate 21c, standing plate 21a, and standing plate 21b described above are integrally made. In the present embodiment, first metal frame 21 is made to have the shape described above by bending one plate material by pressing, for example.

Second metal frame 22 includes bottom plate 22c (second bottom plate), standing plate 22a (second inner peripheral plate), and standing plate 22b (second outer peripheral plate). Bottom plate 22c is formed of four sides of front, rear, left, and right sides.

Standing plate 22a stands from an inner peripheral edge of bottom plate 22c, that is, from a peripheral edge on a side of floating plate 5 (see FIG. 1). Specifically, standing plate 22a is provided on each of the left and right sides of bottom plate 22c, and is not provided on any of the front and rear sides thereof.

Standing plate 22b stands from an outer peripheral edge of bottom plate 22c, that is, from a peripheral edge of bottom plate 22c opposite to the inner peripheral edge thereof. Specifically, standing plate 22b is on an entire periphery of bottom plate 22c, that is, on four sides of front, rear, left, and right sides thereof, respectively.

Bottom plate 22c, standing plate 22a, and standing plate 22b described above are integrally made. In the present embodiment, second metal frame 22 is made to have the shape described above by bending one plate material by pressing.

The height (longitudinal dimension) of each of standing plates 21a, 21b, 22a, and 22b is designed with the same height dimension.

Further, metal frame 20B is formed by assembling first metal frame 21 and second metal frame 22 such that a lower surface of bottom plate 21c of first metal frame 21 overlaps a top surface of bottom plate 22c of second metal frame 22.

By assembling first metal frame 21 having the above-described shape and second metal frame 22 having the above-described shape, on four sides of metal frame 20B, that is, on an entire periphery thereof, the standing plates are provided on inner and outer peripheral sides of metal frame 20B. Specifically, on each of the front and rear sides of metal frame 20B, standing plate 21a is provided on the inner peripheral side of metal frame 20B, and standing plate 22b is provided on the outer peripheral side of metal frame 20B, while on each of the left and right sides of metal frame 20B, standing plates 21a and 22a are provided in an overlapped state on the inner peripheral side of metal frame 20B, and standing plates 21b and 22b are provided in an overlapped state on the outer peripheral side of metal frame 20B. That is, on each of the front and rear sides of metal frame 20B, each standing plate on the inner and outer peripheral sides of metal frame 20B is made of one plate material, while on each of the right and left sides of metal frame 20B, each standing plate on the inner and outer peripheral sides of metal frame 20B is made of two overlapped plate materials. Note that, the standing plates on the inner peripheral side of metal frame 20B may be omitted.

The standing plate of metal frame 20B has a higher strength as the number of plate materials forming the standing plate becomes larger. The standing plate of metal frame 20B has a thinner total plate thickness as the aforementioned number becomes smaller, and further it is possible to reduce the front-rear, left-right, and height dimensions of frame 2.

In the present embodiment, an installation space of frame 2 has margins in the left-right direction so that the standing plates at the left and right thereof are each made of two plate materials to have a high strength. On the other hand, the installation space of frame 2 does not have any margins in the front-rear direction so that the standing plates at the front and rear thereof are each made of one plate material to suppress the dimension of frame 2 in the front-rear direction. Note that, when standing plates 21a, 22a, 21b, and 22b are pressed by cover 90, a force acts on standing plates 21a, 22a, 21b, and 22b via resin frame 20A.

Further, frame 2 is formed by assembling resin frame 20A and metal frame 20B such that a bottom surface of resin frame 20A overlaps a bottom surface of metal frame 20B described above (that is, a top surface of bottom plate 21c of first metal frame 21). It may be configured such that first metal frame 21 and resin frame 20A that have been assembled are assembled to second metal frame 22. That is, resin frame 20A may be ultimately disposed on or above the bottom surface of metal frame 20B between the standing plates on the inner and outer peripheral sides of metal frame 20B.

Further, as illustrated in FIGS. 1, 2A, and 2B, the height dimension of resin frame 20A is set such that resin frame 20A protrudes upward compared with each of leading ends of standing plates 21a, 21b, 22a, and 22b of metal frame 20B.

Further, a plurality of bolts B configured to connect resin frame 20A, first metal frame 21, and second metal frame 22 to each other is screwed to frame 2. Resin frame 20A, first metal frame 21, and second metal frame 22 form frame 2. Through holes H2, and H3, which are provided in each of resin frame 20A, first metal frame 21, and second metal frame 22, and which are arranged upward and downward, allow one bolt B to pass through a set of through holes H1, H2, and H3. Further, a leading end of this bolt B slightly enters through hole H4 provided in upper plate 3 to configure frame 2 and upper plate 3 to have a proper positional relationship.

Through hole H2 is made in first metal frame 21 by pressing, and through hole H3 is made in second metal frame 22 by pressing. Accordingly, the dimensional accuracy and positional accuracy of the hole diameter thereof are lower and variations in products are also larger in comparison with a case where through holes H2 and H3 are made by machining. In order to be capable of absorbing such a low accuracy, each of through holes H2 and H3 is configured to be a hole larger than the diameter of bolt B.

On the other hand, resin frame 20A is made using a molding mold such as a die so that through hole H1 of resin frame 20A is made in resin frame 20A with the same degree of high positional accuracy as through hole H1 formed by machining, and positional variations in products is also small. Further, a screw is formed on an inner peripheral surface of through hole H1.

A position of connection between frame 2 and upper plate 3 by bolt B is defined by through hole H1 of resin frame 20A, and the position of connection is held at an appropriate position.

[2. Action and Effect]

According to the embodiment of the present invention, the following actions and effects are obtained.

(1) Frame 2 is formed of metal frame 20B, and resin frame 20A held on bottom plates 21c and 22c of metal frame 20B between standing plates 21a and 22a on the inner peripheral side of metal frame 20B and standing plates 21b and 22b on the outer peripheral side of metal frame 20B. Accordingly, it is possible to manufacture frame 2 and IC socket 100 in a shorter time than in the related art while maintaining the quality (for example, the strength of the frame, the positional accuracy of the through hole, or the like).

The reason for the above is as follows. First metal frame 21 and second metal frame 22 that form metal frame 20B are formed of bottom plates 21c and 22c, and standing plates 21a, 21b, 22a, and 22b. Thus, first metal frame 21 and second metal frame 22 can be quickly manufactured by pressing of one metal plate. Further, resin frame 20A can be quickly manufactured by resin molding. In addition, the strength of frame 2 can be ensured by metal frame 20B, and the positional accuracy of the through hole, through which bolt B required for connection with other components of frame 2 is inserted, can be ensured by resin frame 20A. Accordingly, as described above, the embodiment of the present invention makes it possible to manufacture frame 2 and IC socket 100 in a short time while maintaining the quality with respect to a case where a frame is manufactured by cutting the frame out of a metal ingot as in the related art.

(2) Forming frame 2 by inserting resin frame 20A having a block shape inside metal frame 20B whose cross-section has a substantially U-shape makes it possible to reduce the number of components forming frame 2 in comparison with a case where frame 2 is formed simply by laminating a plurality of plates.

(3) Forming metal frame 20B with first metal frame 21 and second metal frame 22 makes it possible to obtain a high strength by forming the standing plate of metal frame 20B by overlapping two standing plates of first metal frame 21 and the second metal frame 22. On the other hand, in a case where the installation space of frame 2 is limited, for example, at the front and rear of the installation space, it is possible to form the standing plates at the front and rear of metal frame 20B by means of either first metal frame 21 or second metal frame 22, and to reduce the front-rear dimension of frame 2.

(4) Pressing has a low dimensional accuracy after processing in comparison with machining. Accordingly, in a case where first metal frame 21 and second metal frame 22 are formed by pressing of one plate material, standing plates 21a, 21b, 22a and 22b may have a height greatly deviating from a design height or may have heights different from each other. On the other hand, resin frame 20A can be manufactured with high dimensional accuracy by using a molding mold such as a die. Accordingly, by designing resin frame 20A to be higher than standing plate 21a, 21b, 22a, and 22b regardless of the aforementioned dimensional accuracy by pressing, the height of frame 2 is defined by resin frame 20A, and the height dimension of frame 2 can be appropriately maintained.

(5) Forming resin frame 20A with a heat-resistant resin makes it possible to use frame 2 in a burn-in test performed at a high temperature.

[3. Variation]

Figure 5:
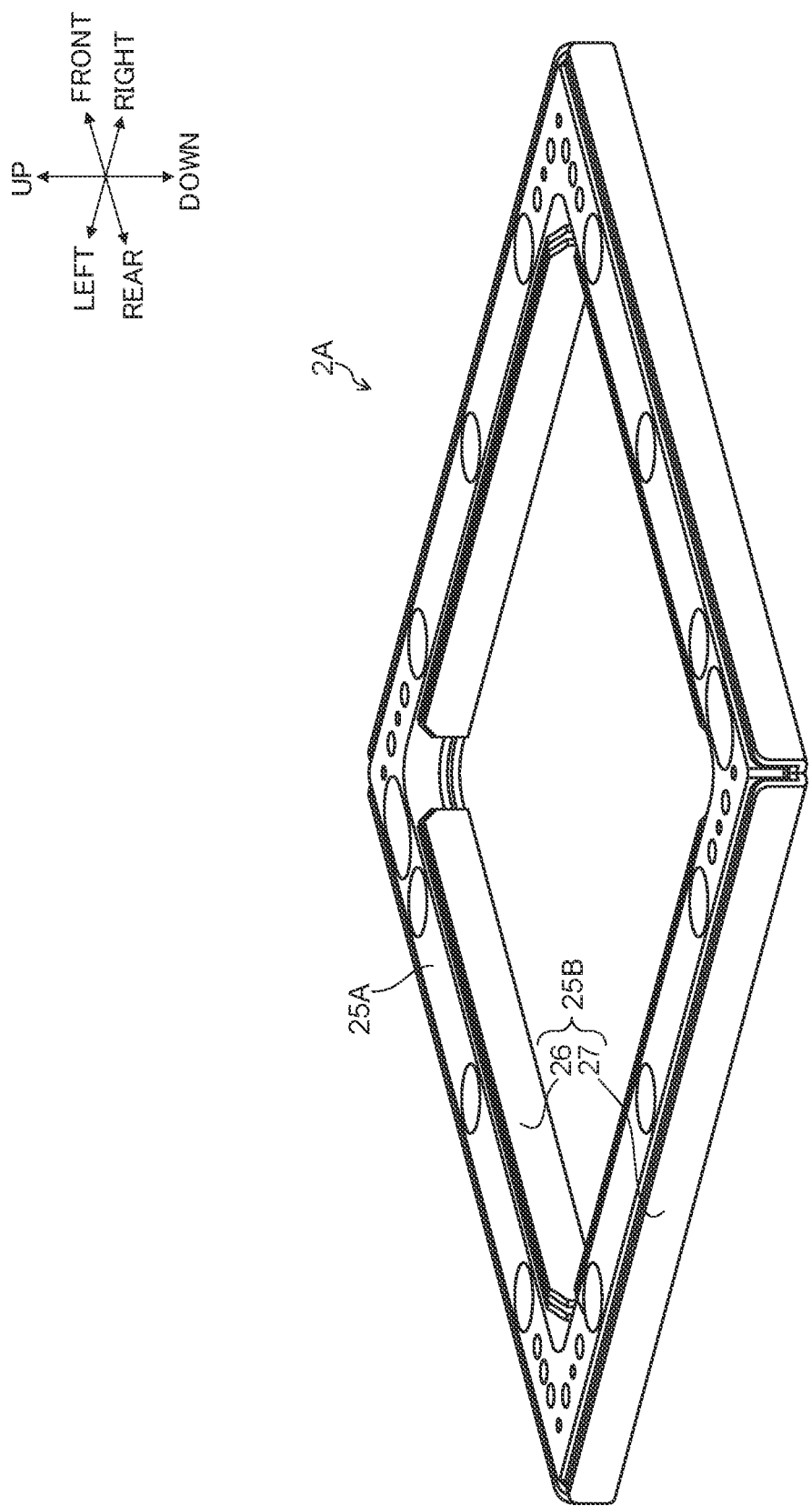
FIG. 5 is a perspective view illustrating a configuration of a variation of the frame for the contact unit of the embodiment of the present invention.
Figure 6:
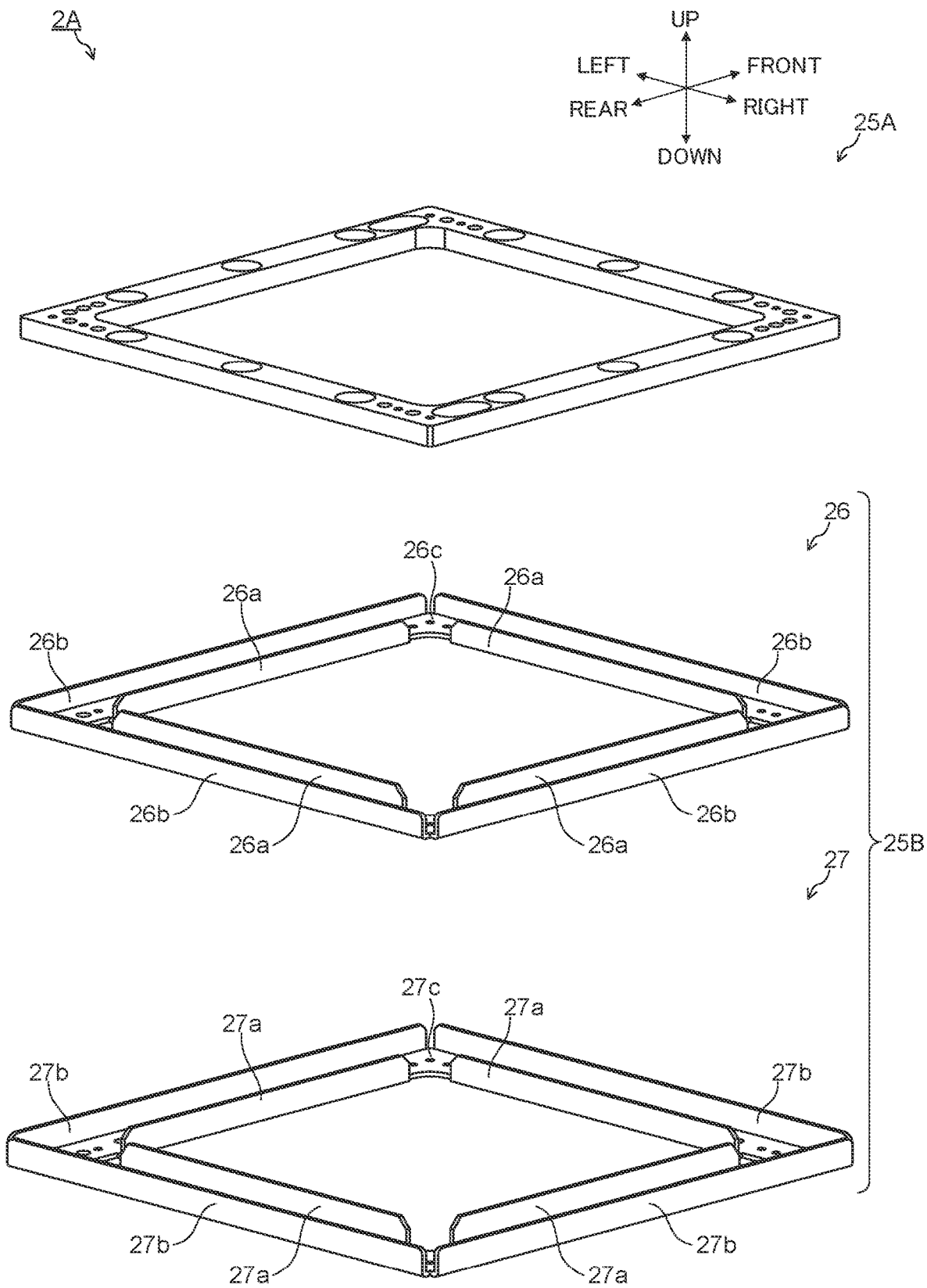
FIG. 6 is an exploded perspective view of the variation of the frame for the contact unit of the embodiment of the present invention.

(1) The configuration of the frame is not limited to the configuration of the embodiment described above. Hereinafter, a configuration of a variation of the frame will be described with reference to FIGS. 5 and 6. FIG. 5 is a perspective view illustrating a configuration of the frame. FIG. 6 is an exploded perspective view of the frame.

As illustrated in FIGS. 5 and 6, frame 2A includes resin frame 25A and metal frame 25B. Metal frame 25B is formed of first metal frame 26 and second metal frame 27. Each of resin frame 25A, first metal frame 26, and second metal frame 27 has a frame shape formed of four sides of front, rear, left, and right sides.

Differing from resin frame 20A of the embodiment described above, resin frame 25A is formed as a single member.

First metal frame 26 includes bottom plate 26c (first bottom plate), standing plate 26a (first inner peripheral plate), and standing plate 26b (first outer peripheral plate). Bottom plate 26c formed of four sides of front, rear, left, and right sides.

Standing plate 26a stands from a peripheral edge of an inner peripheral edge of bottom plate 26c. Standing plate 26b stands from an outer peripheral edge of bottom plate 26c, that is, from a peripheral edge of bottom plate 26c opposite to the inner peripheral edge thereof. Both of standing plate 26a and standing plate 26b are provided on an entire periphery of bottom plate 26c, that is, on four sides of front, rear, left, and right sides thereof, respectively.

Second metal frame 27 includes bottom plate 27c (second bottom plate), standing plate 27a (second inner peripheral plate), and standing plate 27b (second outer peripheral plate). Bottom plate 27c formed of four sides of front, rear, left, and right sides.

Standing plate 27a stands from a peripheral edge of an inner peripheral edge of bottom plate 27c. Standing plate 27b stands from an outer peripheral edge of bottom plate 27c, that is, from a peripheral edge of bottom plate 27c opposite to the inner peripheral edge thereof. Both of standing plate 27a and standing plate 27b are provided on an entire periphery of bottom plate 27c, that is, on four sides of front, rear, left, and right sides thereof, respectively.

Frame 2A is formed by inserting first metal frame 26 inside second metal frame 27. Thus, a standing wall of each side on inner and outer peripheral sides of metal frame 25B is formed of a double wall formed of standing plates 26a and 27a or a double wall formed of standing plates 26b and 27b. Thus, frame 2A differs from frame 2 of the embodiment described above in that all the standing walls of metal frame 25B are double walls.

Other configurations are the same as those in the embodiment described above, thus descriptions thereof will be omitted.

(2) In the embodiment described above, metal frame 20B is formed of two frames of first metal frame 21 and second metal frame 22, but metal frame 20B may also be formed of one frame or of three or more frames.

(3) In the embodiment described above, the frame and the socket of the present invention have been applied to those for inspecting IC packages, but the frame and the socket of the present invention are not limited thereto, and can be applied to those for inspecting other electrical components or to other various applications.

INDUSTRIAL APPLICABILITY

The present invention is suitably utilized as a contact unit frame and a socket.

The present patent application claims the benefit of priority based on Japanese Patent Application No. 2018-209768, filed on Nov. 7, 2018, the entire contents of which including the specification and the drawings are incorporated herein by reference.

REFERENCE SIGNS LIST

1 Contact unit
2, 2A Contact unit frame
3 Upper plate
4 Lower plate
5 Floating plate
5a Coil spring
10 Interconnection substrate
20A, 25A Resin frame
20a Resin frame body
20b Resin block
20B, 25B Metal frame
21, 26 First metal frame
21a, 26a Standing plate (first inner peripheral plate)
21b, 26b Standing plate (first outer peripheral plate)
21c, 26c Bottom plate (first bottom plate)
22, 27 Second metal frame
22a, 27a Standing plate (second inner peripheral plate)
22b, 27b Standing plate (second outer peripheral plate)
22c, 27c Bottom plate (second bottom plate)
80 Base plate 90 Cover
100 IC socket
B Bolt
H1, H2, H3, H4 Through hole

The invention claimed is:

1. A frame for a contact unit,
a resin frame made of resin, composing a front side, a rear side, a left side and a right side at front, rear, left and right positions to surround a housing onion of the contact unit;
a metal frame made of metal, the metal frame including:
    a bottom plate which comprises a front side, a rear side, a left side and a right side at front, rear, left and right positions to surround the housing portion, and on which the resin frame is disposed; and
    an inner peripheral plate and an outer peripheral plate standing in a first direction from an inner peripheral edge and an outer peripheral edge of the bottom plate respectively to cover at least partially an inner part and an outer part of the resin frame on the bottom plate; wherein
the metal frame comprises at least one of the inner peripheral plate and the outer peripheral plate at each of the front side, the rear side, the left side and the right side of the bottom plate.

2. The frame for the contact unit according to claim 1, wherein
the inner peripheral plate is disposed at each of the front side, the rear side, the left side and the right side of the bottom plate.

3. The frame for the contact unit according to claim 2, wherein
the resin frame protrudes in the first direction compared with a leading end of the inner peripheral plate and a leading end of the outer peripheral plate.

4. The frame for the contact unit according to claim 1, wherein
the resin is a heat-resistant resin.

5. The frame for the contact unit according to claim 1, wherein
the metal frame includes:
    a first metal frame; and
    a second metal frame disposed on or above the first metal frame.

6. The frame for the contact unit according to claim 2, wherein:
the metal frame includes:
    a first metal frame; and
    a second metal frame disposed on or above the first metal frame,
the first metal frame includes:
    a first bottom plate; and
    at least one of a first inner peripheral plate and a first outer peripheral plate, the first inner peripheral plate standing in the first direction from an entire periphery or part of the inner peripheral edge of the first bottom plate, the first outer peripheral plate standing in the first direction from an entire periphery or part of the outer peripheral edge of the first bottom plate,
the second metal frame includes:
    a second bottom plate; and
    at least one of a second inner peripheral plate and a second outer peripheral plate, the second inner peripheral plate standing in the first direction from an entire periphery or part of the inner peripheral edge of the second bottom plate, the second outer peripheral plate standing in the first direction from an entire periphery or part of the outer peripheral edge of the second bottom plate,
the bottom plate is formed of the first bottom plate and the second bottom plate,
the inner peripheral plate is formed of at least one of the first inner peripheral plate and the second inner peripheral plate, and
the outer peripheral plate is formed of at least one of the first outer peripheral plate and the second outer peripheral plate.

7. A socket comprising:
a contact unit including a housing portion that houses an electrical component; and
the frame for the contact unit according to claim 1, the frame surrounding the housing portion.

* * * * *